United States Patent
Ueno

[19]

[11] Patent Number: 6,157,268
[45] Date of Patent: Dec. 5, 2000

[54] VOLTAGE CONTROLLED EMITTER COUPLED MULTIVIBRATOR CIRCUIT

[75] Inventor: Naoki Ueno, Tochigi-ken, Japan

[73] Assignee: Nippon Precision Circuits, Inc, Tokyo, Japan

[21] Appl. No.: 09/234,084

[22] Filed: Jan. 19, 1999

[30] Foreign Application Priority Data

Jan. 19, 1998 [JP] Japan .................................. 10-007939

[51] Int. Cl.[7] .................................................. H03K 3/282
[52] U.S. Cl. .................. 331/113 R; 331/144; 331/177 R
[58] Field of Search ............................... 331/113 R, 144, 331/177 R

[56] References Cited

U.S. PATENT DOCUMENTS

| | | | |
|---|---|---|---|
| 4,717,892 | 1/1988 | Hitomi | 331/113 R |
| 5,357,220 | 10/1994 | Francis | 331/113 R |
| 5,467,060 | 11/1995 | Miyashita | 331/74 |
| 5,543,742 | 8/1996 | Takeda | 331/108 B |

FOREIGN PATENT DOCUMENTS

WO 9743830  11/1997  WIPO .

*Primary Examiner*—Siegfried H. Grimm
*Attorney, Agent, or Firm*—Amster, Rothstein & Ebenstein

[57] ABSTRACT

Increase of frequency and reduction of power consumption are advanced for a voltage controlled oscillation circuit. A capacitor C1 is connected between emitters of first and second transistors Tr1, Tr2 to receive an electric current from constant current sources Cs1, Cs2. Also, emitters of third and fourth transistors Tr3, Tr4 receive an electric current from a constant current source Cs3 and have their respective collectors connected through third and fourth resistors R3, R4 to a power supply terminal VCC. The respective collectors and bases of the third and fourth transistors Tr3, Tr4 are connected to bases and collectors of the first and second transistors Tr1, Tr2. Due to this, oscillation outputs are caused at respective ends of the capacitor C1, which has a voltage amplitude equal to a voltage drop due to the third and fourth resistors R3, R4 and values of currents flowing through them. The voltage drop can be decreased to such an extent that the first and second transistors Tr1, Tr2 can be turned on. Also, the voltage drop due to the first and second resistors R1, R2 and the current flowing through them can be decreased to such an extent that the third and fourth transistors Tr3, Tr4 can be turned on. This decreases the resistance value of each resistor and the value of the current flowing therethrough to thereby increase the operating speed and reduce power consumption.

2 Claims, 6 Drawing Sheets

VOLTAGE CONTROLLED EMITTER COUPLED MULTIVIBRATOR CIRCUIT

BACKGROUND OF THE INVENTION

1. Field of the Invention

This invention relates to voltage controlled oscillation circuits.

2. Description of the Related Art

There has been known an emitter-coupled stable multivibrator, for example as shown in FIG. 5, which is conventionally used as a voltage-controlled oscillation circuit. The circuit shown in FIG. 5 has a capacitor c1 connected between emitters of the transistor tr1 and tr2 which are further connected to voltage-controlled current sources cs1 and cs2. As further shown in FIG. 5, the base of tr1 is connected to the collector of tr2 and the base of tr2 is connected to the collector of tr1. Thereafter, the collectors of tr1 and tr2 are connected to a power supply terminal VCC (e.g., 3 V) through diode-connected transistors tr3 and tr4 and resistors r1, r2 connected in parallel with the transistors tr3 and tr4. With the above configuration, the transistors tr1 and tr2 are alternately turned on to cause charging to and discharging from the capacitor c1, thereby effecting oscillation operation. This produces voltage waveforms as denoted by a and b in FIG. 6 on terminals a and b. Here, each transistor is equal in size and the current value in each voltage-controlled current source is determined same. The voltage waveforms a and b oscillate with a base-to-emitter voltage VBE of each transistor as an amplitude value. The frequency is determined by the charge/discharge time of the capacitor c1, which is controlled by varying the current values of the voltage-controlled current sources cs1, cs2. For example, the charge/discharge time is reduced by increasing the current value, which means in the voltage waveforms in FIG. 6 the slant of the voltage waveform becomes abrupt to increase the frequency with amplitude value kept constant.

In the configuration of FIG. 5, the transistors tr3 and tr4 are used as diodes to set the amplitude at the voltage VBE (approximately 0.7 V). The resistors r1 and r2 are provided in parallel with these diodes, in order to raise the potential on the terminals a and b to the potential of the power supply terminal VCC when no current flows through these diodes. In order to fix the amplitude value, there is a necessity, for any current value within a variable range of the voltage-controlled current sources cs1, cs2, to give a voltage drop due to the resistors r1, r2 and such current greater than the voltage VBE. If the voltage drop is not set in that manner, a current flows on a resistor r1, r2 side, making it impossible to ensure the amplitude value. Accordingly, there is a necessity of setting at a certain great value the resistance value of the resistor r1, r2 and/or the current value of the voltage-controlled current source cs1, cs2. However, such a voltage-controlled oscillation circuit is usually used for a PLL or the like, and integrated together with other circuit elements in one chip. If the resistors r1, r2 are increased in size, a floating capacitance will increase to decrease the speed in raising the potential. This, in other words, prevents the frequency from being increased. Due to this, if a high frequency oscillation is desired, the current value of the voltage-controlled current sources cs1 and cs2 requires an increase, making it difficult to reduce the power consumption.

Meanwhile, if frequency is increased by decreasing the capacitance of the capacitor c1, there is a limitation in decreasing the capacitance value of the capacitor c2 if the capacitance is considered relative to the floating capacitance.

As stated above, in order to increase the frequency in the FIG. 5 configuration there is no way but to increase the current value of the voltage-controlled current source cs1, cs2, resulting in difficulty in advancing the reduction in power consumption.

SUMMARY OF THE INVENTION

Therefore, in the present invention a capacitor is connected between the emitters of a first and second transistor to receive an electric current from a constant current source. Also, emitters of a third and fourth transistor having respective collectors connected through third and fourth resistors to a particular potential are connected to a voltage-controlled current source. The respective collectors of the third and fourth transistors are connected to the bases of the first and second transistors so that the states of the collectors of the first and second transistors are received by the bases of the third and fourth transistors. Therefore, oscillation outputs are caused at respective ends of the capacitor, which has a voltage amplitude equal to the voltage drop due to the third and fourth resistors and values of currents flowing through them. The voltage drop can be decreased to such an extent that the first and second transistors can be turned on. Also, the voltage drop due to the first and second resistors and the current from the constant current source can be decreased to such an extent that the third and fourth transistors can be turned on. This decreases the resistance value of each resistor to thereby increase the operating speed. The reduction in value of the current supplied by the constant current source serves to advance the reduction of power consumption.

A voltage controlled oscillation circuit is configured comprising: a switching circuit having a first transistor having a collector connected to a particular potential through a first resistor, a second transistor having a collector connected to the particular potential through second resistor, and a capacitor connected between the emitters of the first and second transistor, so that switching of the first and second transistor causes charging and discharging of the capacitor which causes oscillation outputs at the respective ends of the capacitor; a constant current source for supplying an electric current with a particular current value to the emitter of the first and second transistors; a differential circuit having a third transistor having a base to receive a state of the collector of the first transistor and a collector connected through a third resistor to the particular potential, and a fourth transistor having a base to receive a state of the collector of the second transistor and a collector connected through a fourth resistor to the particular potential so that emitters of the third and fourth transistors are connected to each other, wherein the collector of the third transistor is connected to the base of the first transistor and the collector of the fourth transistor is connected to the base of the second transistor; and a voltage controlled current source for supplying an electric current to a connection point between the emitters of the third and fourth transistors to control a supply current, thereby controlling an oscillation frequency of the oscillation output.

It is preferred that the third and fourth resistors have a particular resistance value and the frequency output has a voltage amplitude equal to a voltage drop due to the third and fourth resistors and electric currents flowing through them, wherein the voltage amplitude is determined by a current value of an electric current supplied to the differential circuit from the voltage controlled current source and the oscillation frequency is controlled by controlling the voltage amplitude.

DETAILED DESCRIPTION OF THE PREFERRED EMBODIMENTS

Figure 1:
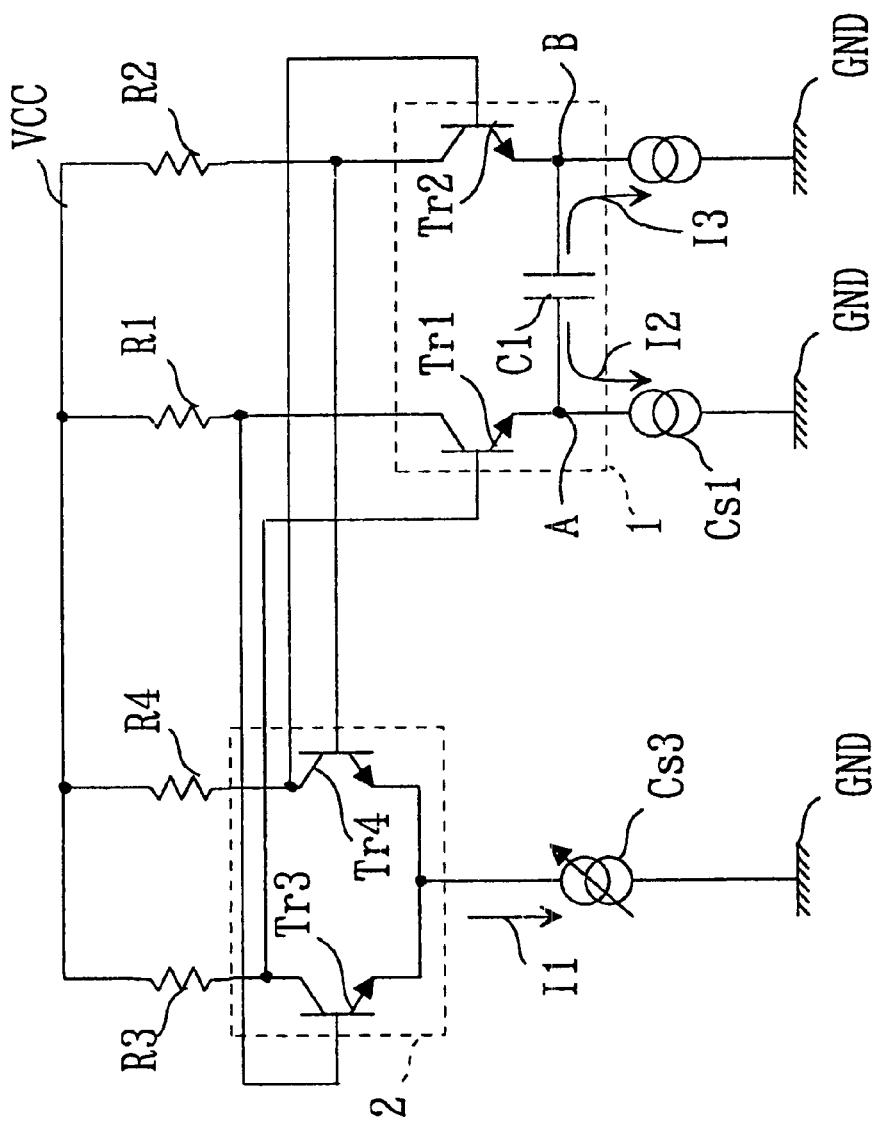
FIG. 1 is an explanatory diagram for explaining a configuration of a voltage-controlled oscillation circuit according to a first embodiment of the present invention.

Now explanation will be made on a voltage-controlled oscillating circuit according to one embodiment of the present invention. FIG. 1 is an explanatory diagram for explaining a configuration of the present embodiment. In the figure, Tr1 and Tr2 are respectively npn-type bipolar transistors as first and second transistors, which are hereinafter referred merely to as transistors. The transistors Tr1, Tr2 have respective collectors connected to a power supply terminal VCC through a resistor R1, R2. Also, a capacitor C1 is connected between emitters of the transistors Tr1 and Tr2 so that these transistors Tr1, Tr2 and capacitor C1 constitute a switching circuit 1. Here, the transistors Tr1 and Tr2 are the same and the resistors R1 and R2 are the same in resistance value.

Cs1 and Cs2 are constant current sources respectively connected to emitters of the transistors Tr1 and Tr2. The constant current sources Cs1 and Cs2 respectively supply currents having a same particular current value to terminals A and B.

Tr3 and Tr4 are respectively npn-type bipolar transistors as third and fourth transistors, which are hereinafter referred merely to as transistors. The transistor Tr3 has a base and a collector respectively connected to the collector and the base of the transistor Tr1. Also, the transistor Tr4 has a base and a collector respectively connected to the collector and the base of the transistor Tr2. The transistors Tr3, Tr4 are respectively connected at their collectors to the power supply terminal VCC through resistors R3 and R4, with their emitters connected to each other thus constituting a differential circuit 2. Here, the transistors Tr3 and Tr4 are the same and the resistors R3 and R4 are the same (characteristic) in resistance value.

Cs3 is a voltage-controlled current source connected to a emitter connection point of the transistors Tr3 and Tr4 to supply current to the differential circuit 2. The voltage-controlled current source Cs3 is formed, for example, by a not-shown transistor having an emitter connected through a resistor to a power supply terminal GND so that it generates at a collector a current with value in dependence upon a control voltage received on a base.

Figure 2:
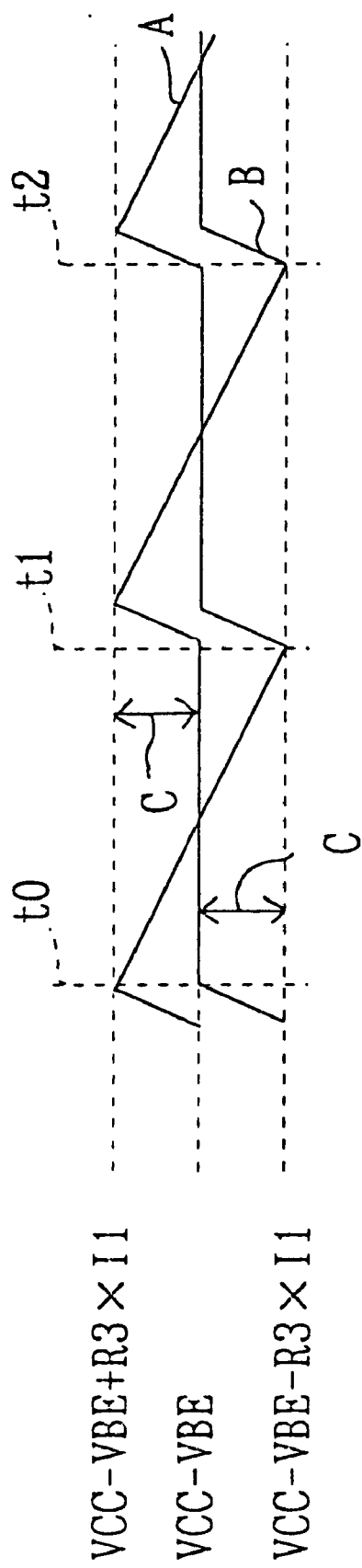
FIG. 2 is a waveform diagram for explaining the operation of FIG. 1.

Now the operation of this embodiment will be explained with reference to a waveform diagram of FIG. 2. In the figure, A and B respectively represent voltage waveforms occurring at terminals A and B.

It is assumed that at timing t0 the transistors Tr1 and Tr2 are respectively off and on. If the transistor Tr1 is off, the base of the transistor Tr3 rises in potential to that of the power supply terminal VCC. If the transistor Tr2 is on, the base of the transistor Tr4 lowers in potential and the transistors Tr3 and Tr4 respectively become on and off. Assuming that a current supplied from the voltage-controlled current source Cs3 to the differential circuit 2 is I1, the transistor Tr3 has a current I1 as a collector current. Assuming that the resistor R3 has a resistance value R3 and the current I1 has a current vale I1, the base potential of the transistor Tr1 rises by R3×I1. Assuming that the potential of the power supply terminal is VCC and the base-to-emitter voltage of the transistor Tr1 is VBE, the potential on the terminal A is VCC−VBE+R3×I1. Also, the turning off of the transistor Tr4 causes the base potential of the transistor Tr2 to rise to a potential of the power supply terminal VCC, bringing the potential on the terminal B to VCC−VBE. Due to this, the constant current source Cs1 has a current I2 flowing to the capacitor C1 to lower the potential on the terminal A, as shown by an arrow in FIG. 1.

If thereafter the potential on the terminal A becomes VCC−VBE−R3×I1 at timing t1, the transistor Tr1 between its base and emitter is biased forward and the transistor Tr1 turns on. Receiving this, the transistors Tr3 and Tr4 respectively effect differential operations toward off and on, causing the transistor Tr2 to turn off.

The turning on of the transistor Tr1 raises the base potential of the transistor Tr1 up to a potential of the power supply terminal VCC, and the potential on the terminal A becomes VCC−VBE. Due to the turning off of the transistor Tr2, the transistor Tr4 has a current I1 as a collector current. Assuming that the resistance value of the resistor R4 is R4, the transistor Tr2 has a base potential raised by R4×I1. Because R4=R3, the potential on the terminal A is VCC−VBE and the potential on the terminal B is VCC−VBE+R3×I1. Due to this, the constant current source Cs2 has a current I3 flowing to the capacitor C1 as shown by an arrow in FIG. 1, thereby lowering the potential on the terminal B. If thereafter the potential on the terminal B becomes VCC−VBE−R3×I1 at timing t2, the transistors Tr1 and Tr2 respectively turn off and on. The repetition of the above operation causes an oscillation output with a voltage amplitude equal to R3×I1 at the terminals A, B. Incidentally, the voltage amplitude herein means a width shown by C—C in FIG. 2, not peak-to-peak.

In the present embodiment, provided that the capacitance of the capacitor C1 is C1, the current value of the current I2, I3 is I2, I3, the slant in each of the voltage waveforms A, B is I2/C1 (=I3/C1) which value is fixed. The oscillation frequency is changed not by changing the slant but by changing the value of the current I1 to change the voltage amplitude. This voltage amplitude value has no bearing on the transistor base-to-emitter voltage, which is rather determined by R3×I1 as a voltage drop due to the resistor R3, R4 and the current I1 flowing therethrough. Due to this, the resistance value of the resistor R3, R4 can be decreased to such a value that the value R3×I1 becomes approximately 100 mV–500 mV required for switching the transistor Tr1, Tr2 within a variable range of the current I1. That is, the resistors R3, R4 are by far small in value as compared with the resistance value conventionally required to obtain a voltage amplitude vale 0.7 V determined by the base-to-emitter voltage. This makes it possible to suppress against delay due to floating capacitance and increase operation speed, increasing oscillation frequency. Also, the variable range of the current I1, although dependent upon balance with operating speed, is reduced in value as compared with that of the conventional, serving to reduction in power consumption. The current values of the currents I2, I3 are predetermined irrespective of frequency control. Due to this, the voltage drop by the resistors R1, R2 and currents I2, I3 can be rendered approximately 100 mV which can always switch the transistors Tr3, Tr4 without limitation by the aforesaid variable range. Thus the values of the currents I2, I3 and the resistors R1, R3 are optimally given in respect of the balance between high speed operation and low power consumption.

Incidentally, in the above embodiment the structure particularly to output an oscillation output to a rear stage was not explained in order to facilitate understanding the operation and effect of the present invention. This, however, may be done by amplifying on a state of collectors of the transistors Tr1, Tr2 and outputting through an emitter follower. Also, the capacitor C1 was always connected with the constant current sources Cs1, Cs2. However, if the capacitor is connected, only at a discharge side, with a constant current source, further reduction in power consumption is possible. These two points are realized by configuring a voltage-controlled oscillation circuit as in a second embodiment stated hereinbelow.

Figure 3:
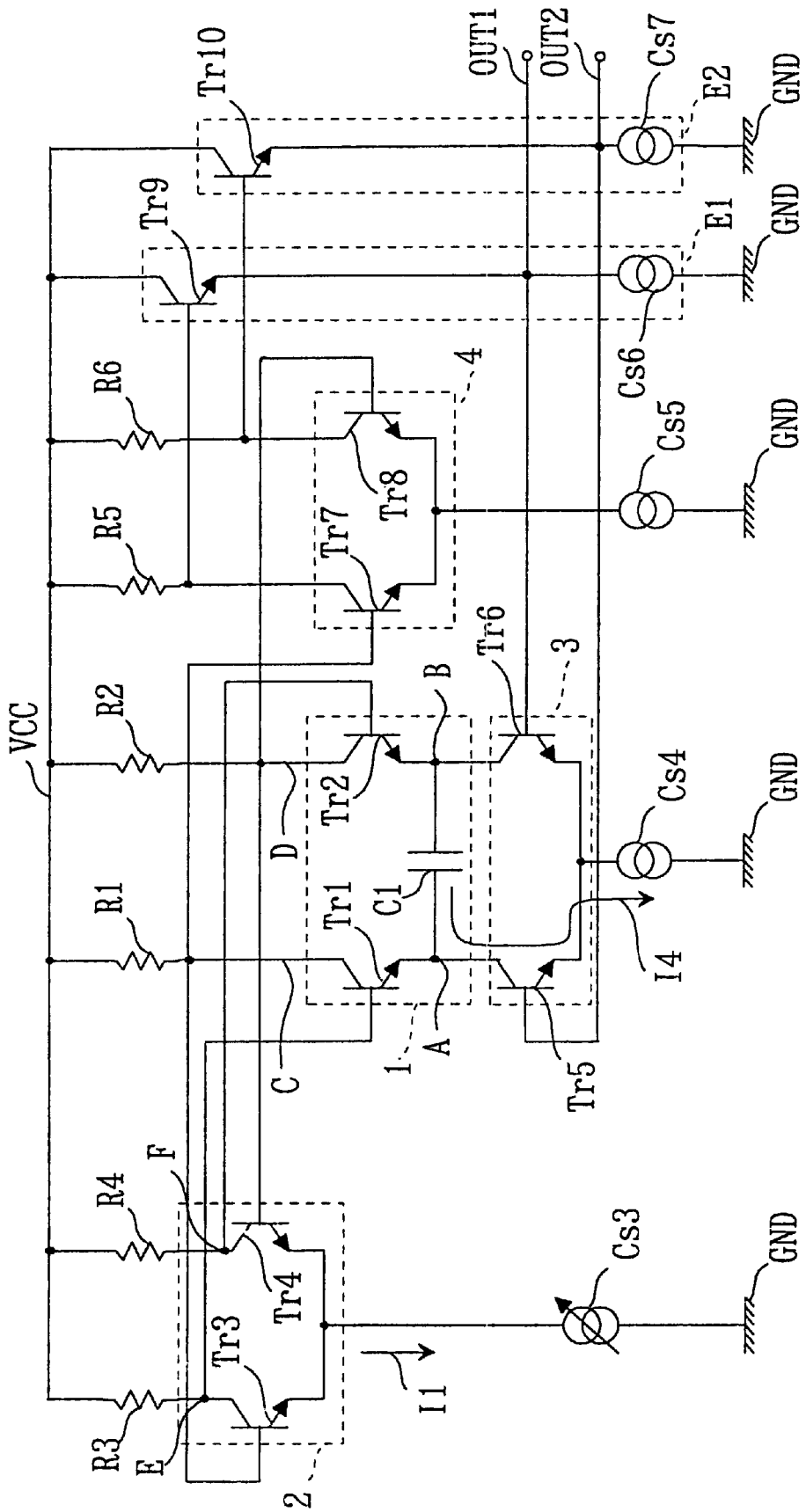
FIG. 3 is an explanatory diagram for explaining a configuration of a voltage-controlled oscillation circuit according to a second embodiment of the present invention.

FIG. 3 is an explanatory view showing a configuration of a voltage-controlled oscillation circuit according to a second embodiment. In the figure, the same reference symbols as those used in FIG. 1 denote the same elements in FIG. 1. In the figure, Tr5–Tr10 are npn-type bipolar transistors and hereinafter referred merely to as transistors. Cs4–Cs7 are constant current sources. The transistors Tr5 and Tr6 have respective collectors connected to terminals A and B with their emitters connected to the constant current source Cs4, thus constituting a differential circuit 3. The transistors Tr5 and Tr6 alternately turn on and off to alternately connect the terminals A and B to the constant current source Cs4. Also, the transistors Tr7 and Tr8 have respective collectors connected through resistors R5 and R6 to a power voltage terminal VCC with their emitters connected to the constant current source Cs5, thus constituting a differential circuit 4. Incidentally, the resistors R5 and R6 are same in resistance value. Also, the transistors Tr7 and Tr8 have respective bases connected to the collectors of the transistors Tr1 and Tr2. The transistors Tr9 and Tr10 at their bases are respectively connected to collectors of the transistors Tr7 and Tr8 with their emitters respectively connected to the constant current sources Cs6 and Cs7, constituting respective emitter followers E1 and E2. Incidentally, the constant current sources Cs6 and Cs7 output currents in a same value. The transistors Tr9, Tr10 respectively have output terminals OUT1 and OUT2 at emitters to output an oscillation output to a not-shown rear stage. Also, the output terminals OUT1 and OUT2 are respectively connected to the transistors Tr6 and Tr5. Incidentally, the emitter followers E1, E2 can be appropriately modified in accordance with the rear stage.

Although not shown, diode-connected transistors for example may be provided respectively between the transistors Tr9, Tr10 and the constant current sources Cs6, Cs7, to provide output terminals OUT1, OUT2 between the added transistors and the constant current sources Cs6, Cs7 or transistors Tr9, Tr10.

Now the operation of this embodiment will be explained. In also this embodiment, the switching operation of each transistor in the switching circuit 1 and differential circuit 2 is the same as that of the first embodiment. The voltage waveforms on the terminals A, B will be explained as forms shown in FIG. 2, for convenience sake. At timing t0 the transistors Tr1 and Tr2 respectively turn on and off. In response to this, the transistors Tr3 and Tr4 turn on and off so that the potential on the terminal A becomes VCC−VBE+R3×I1 while the potential on the terminal B becomes VCC−VBE. In response to turning off and on of the transistors Tr1 and Tr2, the transistors Tr7 and Tr8 of the differential circuit 4 respectively turn on and off, bringing the transistors Tr9 and Tr10 of the emitter followers E1 and E2 respectively to off and on. Due to this, the output terminal OUT1 and OUT2 respectively become "L" and "H" to turn on and off the transistors Tr5 and Tr6 of the differential circuit 3. This connects the terminal A, in place of the terminal B, to the constant current circuit Cs4 as shown by the arrow in FIG. 3. Accordingly, a current I4 by the constant current source Cs4 flows into the capacitor C1, lowering the potential on the terminal A. At this time, the collector current of the transistor Tr2 becomes nearly the current I4. Although in the above-stated first embodiment the transistor Tr2 for example when on has a current at its collector in a value added together the currents I2 and I3, the present embodiment is further advanced in power consumption as compared to that embodiment. When the potential on the terminal A becomes VCC−VBE−R3×I1 at timing t1, the transistors Tr1 and Tr2 respectively turn on and off. In response to this, the transistors Tr3 and Tr4 are turn on and off to bring the potential on the terminal A to VCC−VBE and the potential on the terminal B to VCC−VBE+R3×I1. In response to this, the respective transistors of the differential circuit 4 and the emitter followers E1, E2 in on and off states are switched over. This causes the output terminals OUT1 and OUT2 to "H" and "L" to turn off and on the transistors Tr5 and Tr6 of the differential circuit 3. Due to this, the terminal B, in place of the terminal A, is brought into connection to the constant current circuit Cs4 to discharge the charged electricity on the capacitor C1 through the terminal B. This switching over between the terminals A and B is caused by transmitting the collector states of the transistor Tr1 and Tr2 to the differential circuit 3 through the differential circuit 4 and the emitter followers E1, E2. The switching timing is somewhat retarded from the switching of the transistor Tr1, Tr2. This delay sufficiently lowers the potential on the terminal A or B to ensure the switching in the transistors Tr1, Tr2. Thereafter, if the potential on the terminal B becomes VCC−VBE−R3×I1 at timing t2, the transistors Tr1 and Tr2 turn off and on to connect the terminal A, in place of the terminal B, to the constant current circuit Cs4. The repetition of the above operation provides oscillation outputs on the terminals OUT1 and OUT2.

Figure 4:
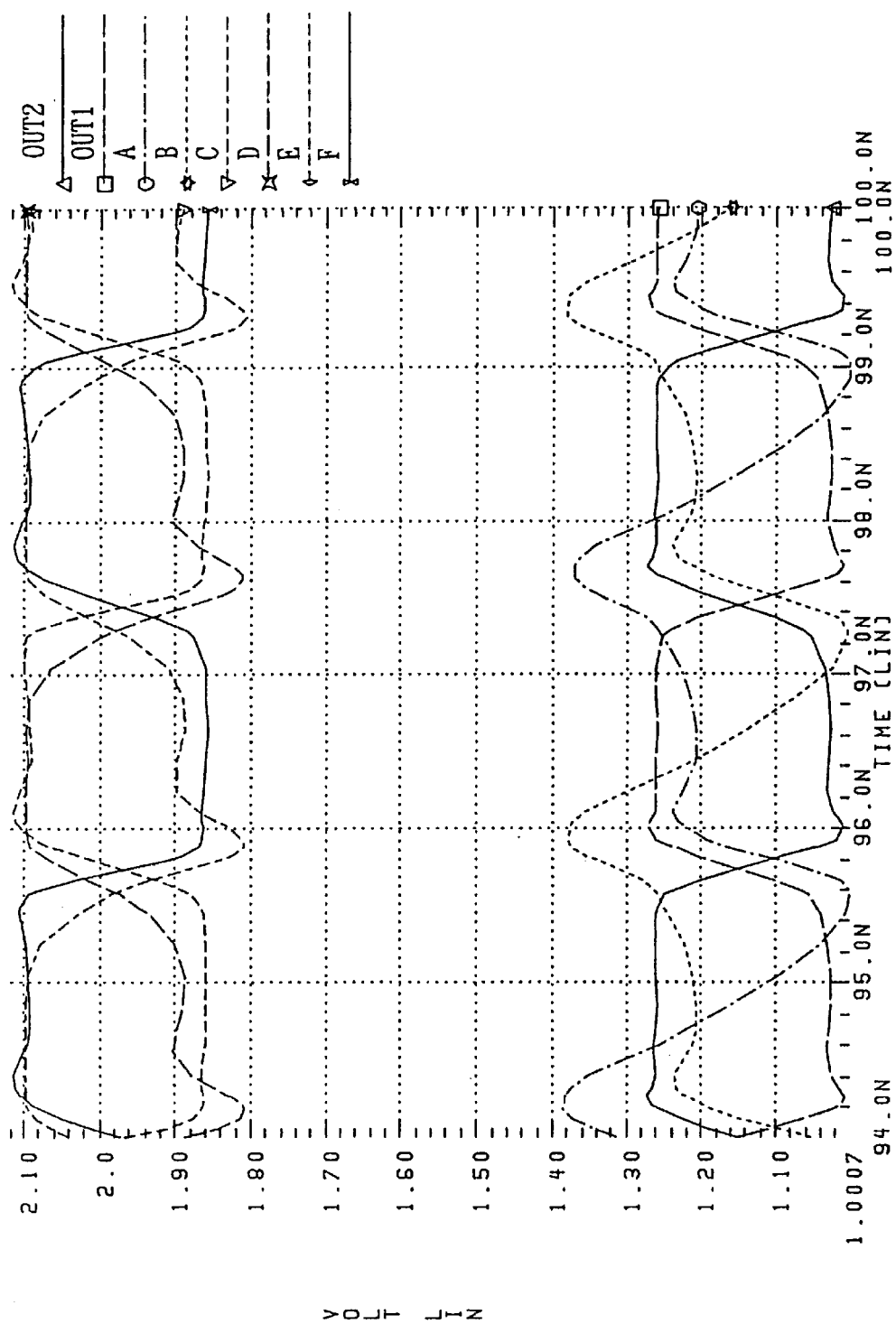
FIG. 4 is a waveform diagram for explaining the operation of FIG. 3.
Figure 5:
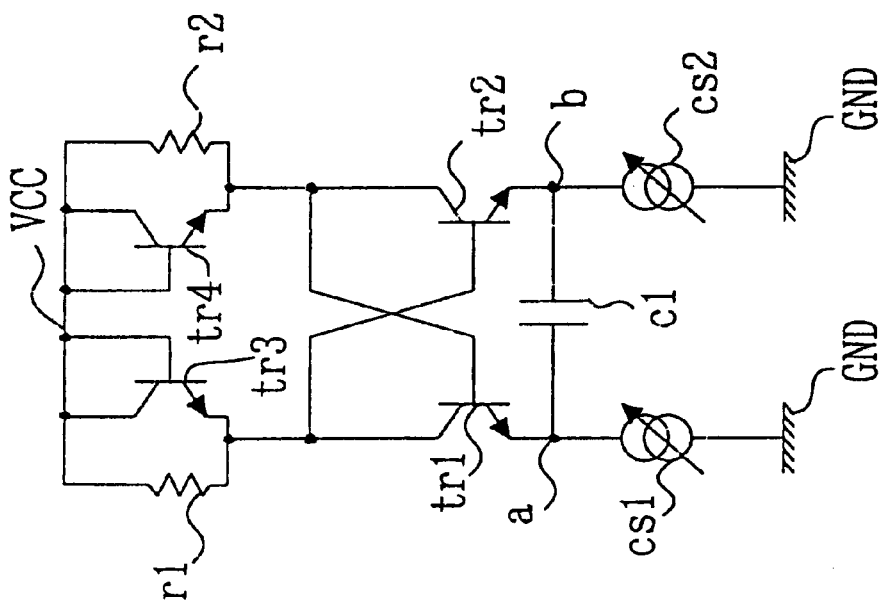
FIG. 5 is an explanatory diagram for explaining a configuration prior art voltage-controlled oscillation circuit.
Figure 6:
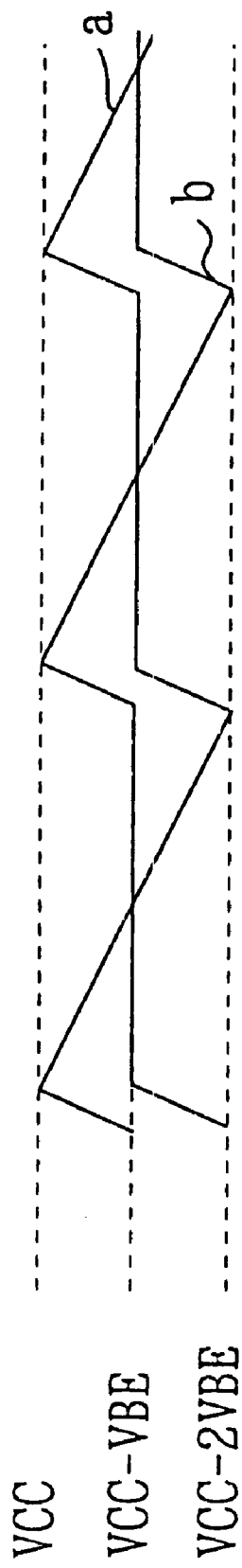
FIG. 6 is a waveform diagram for explaining the operation of FIG. 5.

Also, simulation was conducted on the voltage-controlled oscillation circuit in this embodiment with the characteristic and circuit constant of each of the transistors determined at an appropriate value. As a result, voltage waveforms as shown in FIG. 4 were obtained. In the figure, the waveforms shown by the same reference symbols used for the terminals in FIG. 3 represent voltage waveforms on corresponding terminals, respectively. From this figure, the above-stated operation will be understood.

As stated above, the present embodiment provides a similar operation and effect to those of the first embodiment, wherein the reduction in consumption power can be further advanced.

Although in the above embodiments the transistors were npn-type bipolar transistors, they may employ pnp-type bipolar transistor. In such a case, the power supply terminal is inverted in polarity.

In the present invention, oscillation outputs are caused at the respective ends of the capacitor, which has a voltage amplitude equal to a voltage drop due to the third and fourth resistors and values of currents flowing through them. The voltage drop can be decreased to such an extent that the first and second transistors can be turned on. Due to this, it is possible to reduce the resistance value of the third and fourth resistors to an extent that a sufficient voltage drop is obtained in a variable range of current value of the voltage controlled current source. Further, although dependent upon the balance with operating speed, it is possible for the voltage controlled current source to reduce in value the variable range as compared with that of the conventional, and advance power consumption. Also, the voltage drop due to the first and second resistors and the current from the constant current source can be decreased to such an extent that the third and fourth transistor can be turned on. Because the constant current source has no bearing on frequency control, it is possible to reduce the resistance value of the first and second resistors and current value of the constant current source as small as possible without limitation in the variable range as in the current value of the voltage controlled current source and resistance values of the third and forth resistances.

This reduces floating capacitance for each resistor, and improves oscillation frequency. Also, the reduction in current value of the voltage controlled current source and the constant current source can help advance power consumption.

What is claimed is:

1. A voltage controlled oscillation circuit comprising:
   a switching circuit comprising a capacitor and first and second transistors; collectors of said transistors each connected to a power supply through one of a pair of resistors respectively, emitters of said transistors connected through said capacitor;
   a first differential circuit connected to a voltage controlled current source;
   a second differential circuit connected to a constant current source, said emitters of said transistors of said switching circuit defining oscillation outputs and connected to said second differential circuit;
   said first differential circuit switching said first and second transistors of said switching circuit in an alternate manner;
   a third differential circuit, connected to said switching circuit and said first differential circuit, said third differential circuit controlled by the switching of said transistors of said switching circuit, said third differential circuit connected to a constant current source;
   a pair of output transistors, said third differential circuit controlling said pair of output transistors, said output transistors having output terminals at their emitters, said emitters of said output transistors controlling said second differential circuit;
   said switching circuit and second differential circuit causing the charging and discharging of said capacitor; and
   said variable current source being controlled by a voltage thereby controlling an oscillation frequency of said oscillation outputs.

2. A voltage controlled oscillation circuit according to claim 1, wherein said first differential circuit comprises a pair of transistors, collectors of said transistors each connected to said power supply through one of a second pair of resistors respectively; and the oscillation frequency has a voltage amplitude equal to a voltage drop due to said second pair of resistors connecting said first differential circuit to said power supply and current through them, wherein the voltage amplitude is determined by a current value of an electric current to said first differential circuit from said voltage controlled current source and the oscillation frequency is controlled by controlling the voltage amplitude.

* * * * *